United States Patent [19]

Ip et al.

[11] Patent Number: 4,617,651

[45] Date of Patent: Oct. 14, 1986

[54] REDUNDANCY CIRCUIT FOR USE IN A SEMICONDUCTOR MEMORY ARRAY

[75] Inventors: William W. Ip, San Jose; Gust Perlegos, Fremont, both of Calif.

[73] Assignee: Seeq Technology, Inc., San Jose, Calif.

[21] Appl. No.: 582,438

[22] Filed: Feb. 22, 1984

[51] Int. Cl.[4] ............................................. G11C 11/40
[52] U.S. Cl. .................................. 365/200; 365/210; 365/189
[58] Field of Search ............... 365/200, 210, 189, 230, 365/182

[56] References Cited

U.S. PATENT DOCUMENTS 4,233,674  11/1980  Russell et al. ...................... 365/200
4,464,736   8/1984  Smith ................................. 365/200
4,523,313   6/1985  Nibby, Jr. et al. ................. 365/200

Primary Examiner—Terrell W. Fears
Attorney, Agent, or Firm—Lyon & Lyon

[57] ABSTRACT

A semiconductor memory circuit having primary and redundant arrays with the capability of substituting the redundant arrays for defective primary arrays by address location.

9 Claims, 2 Drawing Figures

REDUNDANCY CIRCUIT FOR USE IN A SEMICONDUCTOR MEMORY ARRAY

TECHNICAL FIELD

The present invention generally relates to semiconductor memory chips and is more particularly directed to a circuit for programming a redundant row in the chip memory array using address bits associated with a faulty word line in the primary memory array.

SUMMARY OF THE INVENTION

The programming circuit of the present invention is specifically designed for use with a semiconductor memory chip divided into primary and redundant memory arrays. The circuit is capable of being programmed to enable a redundant word line in the redundant array whenever an address bit associated with a faulty word line in the primary array is input to the chip. The programming circuit includes a fuse, a high voltage latch circuit which functions to blow the fuse when the address bit associated with the faulty word line has a logic high or "one" value and an output circuit which functions to ground the redundant word line unless the address bit associated with the faulty word line is input to the memory chip. The output circuit in particular comprises a pull-down transistor and a pair of additional transistors which pass either the address bit or its compliment to the gate of the pull-down transistor depending upon whether the address bit associated with the faulty word line is a logic high or logic low signal. If the associated address bit has a logic high value, its compliment will pass to the gate of the pull-down transistor. Conversely, if the associated address bit has a low logic value, the address bit itself will pass to the gate of the pull-down transistor. In either event, the pull-down transistor remains off only when the associated address bit is input to the memory chip. A latch means in the output circuitry is employed to latch one of the two additional transistors on and the other of the two transistors off to insure that the proper logic value reaches the pull-down transistor during addressing operations.

BRIEF DESCRIPTION OF THE DRAWINGS

The various features, objects and advantages of the present invention can be better understood by considering the following Brief Description of the Drawings in conjunction with the Best Mode for Carrying Out the Invention, wherein.

BEST MODE FOR CARRYING OUT THE INVENTION

Semiconductor memory chips are often fabricated with both primary and redundant arrays of memory cells. In a 64-k bit memory chip, for example, the primary array includes two hundred and fifty-six primary word lines and two hundred and fifty-six y-select or bit lines, which latter lines may be subdivided into eight groups of thirty-two y-select lines each to permit simultaneous selection of a data byte (e.g., an eight bit data word) using only a single y-address. A digital address signal $A_0$–$A_{12}$ input to the chip accesses each data byte location in the primary array. The first five address bits $A_0$–$A_4$ establish the particular y-address of each data byte while an additional eight address bits $A_5$–$A_{12}$ establish the data byte x-address. The redundant array, on the other hand, includes one or more "redundant" word lines tied to rows of redundant memory cells which are accessed in lieu of rows containing faulty memory cells in the primary memory array. When faulty memory cells connected along a word line in the primary array are detected, the redundant row is programmed such that input of the x-address associated with the primary word line containing the faulty memory cells results instead in enablement of a redundant word line. Thereafter, the primary memory array is disabled and the y-address input to the memory array selects a memory cell on the redundant word line at a y location corresponding to the y location of the faulty memory cell.

Figure 1:
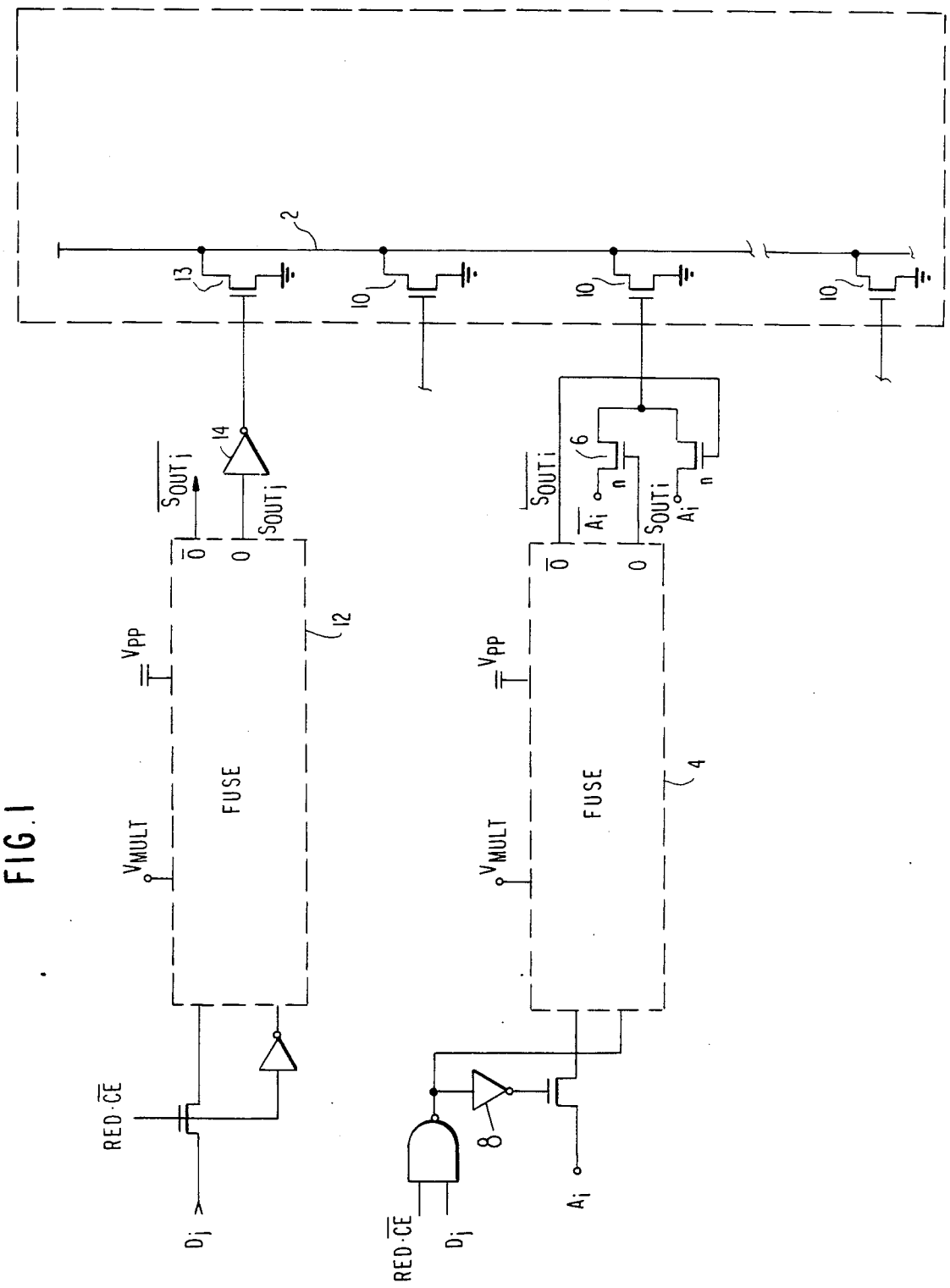
FIG. 1 is a schematic representation of a redundant array in a semiconductor memory chip, the redundant array including a redundant word line and a plurality of fuse circuits which can be programmed using the address bit associated with a faulty word line in the primary memory array.

FIG. 1 illustrates a redundant word line 2 and a representative fuse circuit 4 associated with a particular x-address bit $A_i$ of the digital address signal. Fuse circuit 4 provides a pair of complementary outputs $S_{outi}$ and $\overline{S_{outi}}$ which alternately gate a pair of n-channel transistors 6, 8 to pass either the $A_i$ address bit or its compliment $\overline{A_i}$ through to the gate of a pull-down transistor 10 connected to redundant word line 2. Whenever redundant word line 2 is to be used instead of a faulty primary word line in the primary memory array, fuse circuit 4 is programmed to output that combination of $S_{outi}$ and $\overline{S_{outi}}$ signals necessary to pass the low logic value in the pair of address signals $A_i$, $\overline{A_i}$, through transistors 6 and 8 to the gate of pull-down transistor 10, keeping pull-down transistor 10 in an off condition to permit enablement of redundant word line 2. Thus, if the $A_i$ address bit associated with faulty primary word line is a logic "one", fuse circuit 4 is programmed to output a high $S_{outi}$ signal and a low $\overline{S_{outi}}$ signal. Transistor 8 is subsequently switched off to prevent the high $A_i$ signal from reaching the gate of pull-down transistor 10, whereas transistor 6 is switched on by the high $S_{outi}$ signal and the low $\overline{A_i}$ address signal reaches the gate of the pull-down transistor to insure that the pull-down transistor remains off. Conversely, when the $A_i$ address bit associated with the faulty primary word line is a logic low or "zero", $S_{outi}$ from fuse circuit 4 is low to prevent the high complement signal $\overline{A_i}$ from reaching the gate of the pull-down transistor and the $\overline{S_{outi}}$ signal from fuse circuit 4 shifts high to gate the low $A_i$ address signal through to the pull-down transistor gate, again leaving the pull-down transistor in an off condition.

One fuse circuit 4 is constructed for each address bit $A_i$ used to access an x-address location, e.g., a primary word line, in the memory chip. Upon reflection, it is evident that when all of the fuse circuits have been programmed with the particular x-address of a faulty word line in the primary memory array, the pull-down transistors connected to the fuse circuits will remain off, and the redundant word line will accordingly be enabled, only when all of the x-address bits associated with the x-address of the faulty word line in the primary memory array are input to the memory chip. If an x-address other than the x-address of the faulty word line is present, at least one of the pull-down transistors connected to the fuse circuits will be gated on to ground the redundant word line and prevent enablement thereof.

An additional fuse circuit 12 and pull-down transistor 13 may also be provided in the redundant memory array, which additional fuse circuit receives a redundant word line select signal $D_j$. When redundant word line 4 is pressed into use, the redundant word line select signal $D_j$ is switched high, causing fuse circuit 12 to output a high logic signal which is inverted by inverter 14 to turn off pull-down transistor 13 and remove the source of ground from the redundant word line. If the redundant word line is not to be used, the redundant word line select signal $D_j$ is left low and fuse circuit 12 outputs a low logic signal which turns on pull-down transistor 13, connecting the word line 4 to ground through pull-down transistor 13. In this manner, simultaneous accessing of redundant word line 4 and the primary word line at the "zero" x-address (i.e., the x-address having all "zero" address bits) is prevented.

Figure 2:
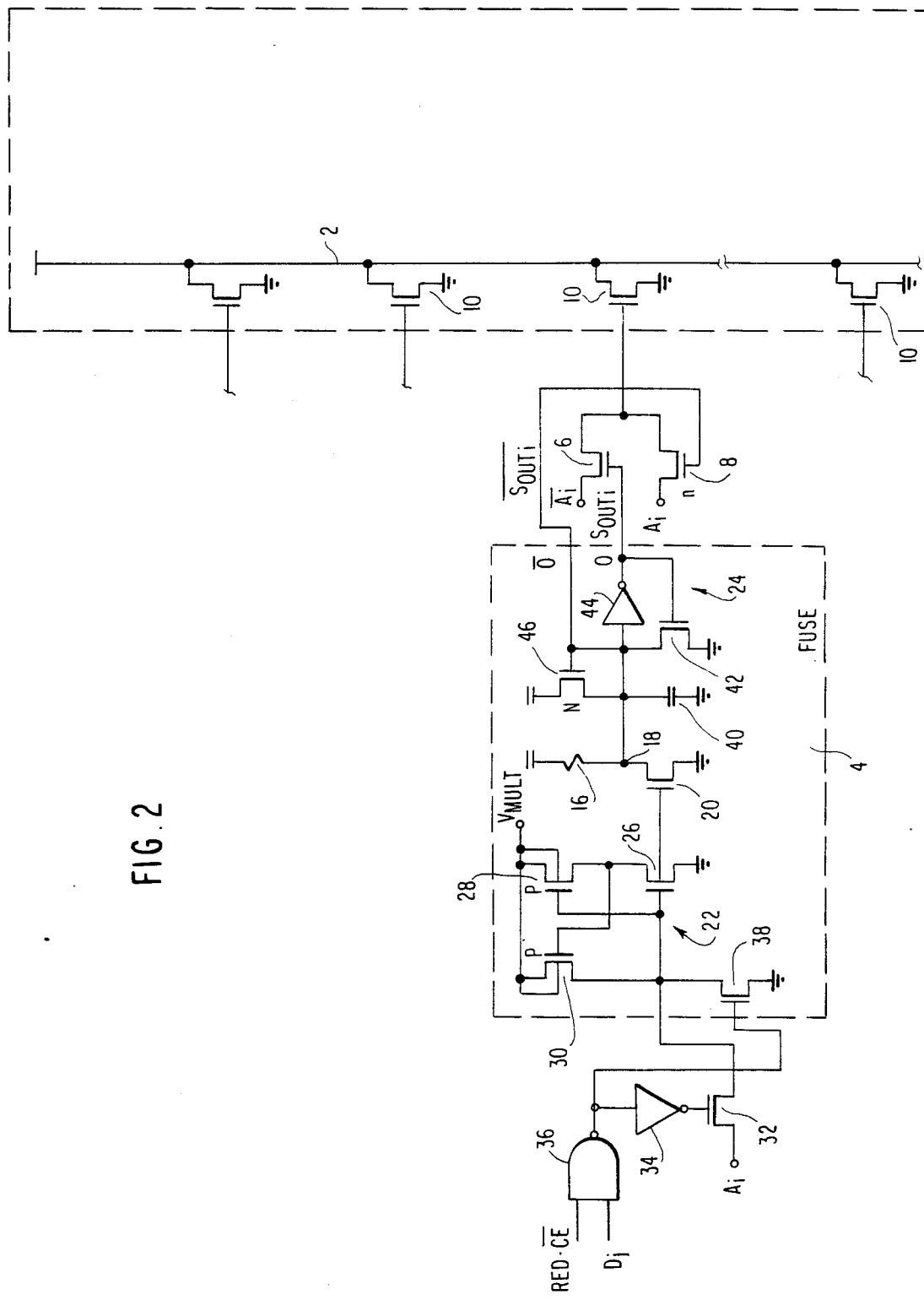
FIG. 2 is a detailed circuit schematic of the fuse circuit of FIG. 1.

The representative fuse circuit 4 of FIG. 1 is illustrated in detail in FIG. 2. Fuse circuit 4 includes a polysilicon fuse 16 connected between a source of programming voltage $V_{pp}$ and voltage node 18, a pull-down transistor 20 tied to voltage node 18, a high voltage latch 22 connected to the gate of pull-down transistor 20 for the purpose of blowing fuse 16, and an output latch 24 for latching the voltage of voltage node 20 in order to generate the output signals $S_{outi}$ and $\overline{S_{outi}}$ of fuse circuit 4. High voltage latch 22 includes an n-channel transistor 26 and two p-channel transistors 28 and 30. The gates of transistors 26 and 28 receive the $A_i$ address bit via n-channel transistor 32 while the gate of transistor 30 is connected to the source of transistor 26. A programming voltage $V_{mult}$, which may be approximately 18 volts for a typical EPROM memory array configuration, supplies the sources of transistors 28 and 30. The gate of transistor 32 is connected to an inverter 34 driven by the output of NAND gate 36 in response to the state of redundant word line select signal $D_j$ and a combination REDUNDANCY ENABLE/CHIP ENABLE signal (RED·CE). The NAND gate also drives pull-down transistor 38.

Output latch 24 includes a capacitor 40 connected between voltage node 18 and ground, a pull-down transistor 42 connected between voltage node 18 and ground, an inverter 44 connected between voltage node 18 and the gate of pull-down transistor 42 and an n-channel pull-up transistor 46 connected between node 18 and a source of potential $V_{pp}/V_{cc}$. Voltage node 18 supplies the $\overline{S_{outi}}$ signal of fuse circuit 4 and inverter 44 supplies the $S_{outi}$ signal of the fuse circuit.

During programming, the $A_i$ address bit is set to the value associated with the x-address of the faulty primary word line. The $D_j$ signal is set high to select redundant word line 2 via fuse circuit 12, the combination REDUNDANCY ENABLE/CHIP ENABLE signal is set high to prepare for redundant word line programming, and the combined action of NAND gate 36 and inverter 34 switch transistor 32 on to pass the $A_i$ address bit to the high voltage latch. Pull-down transistor 38 is, of course, switched off by the low output of the NAND gate. If the $A_i$ address bit associated with the x-address of the faulty word line is high, transistor 28 remains off because of its p-channel characteristics while transistor 26 is gated on to ground the gate of p-channel transistor 30, turning transistor 30 on and transferring the high programming voltage $V_{mult}$ to the gate of pull-down transistor 20. Pull-down transistor 20 is accordingly turned on to ground voltage node 18 in output latch 24. Current drawn from the source of programming voltage $V_{pp}$ travels through fuse 16 to ground, in the process blowing the fuse. Meanwhile, the grounded condition on node 18 causes the output of inverter 44 to switch high, turning transistor 42 on to lock node 18 at ground level. The inverter output or $S_{outi}$ signal is consequently latched high to turn on transistor 16 and the $\overline{S_{outi}}$ signal is latched low to turn off transistor 18. Thereafter, whenever a high $A_i$ address is input to the memory chip, the low value of the complementary $\overline{A_i}$ signal will pass through transistor 6 to the gate of pull-down transistor 10, keeping the pull-down transistor in an off condition.

If the $A_i$ address bit associated with the x-address of the faulty word line is low, a low $A_i$ bit is passed to fuse circuit 14 during programming. Transistor 26 remains off, transistor 28 switches on to pass $V_{mult}$ to the gate of transistor 30 and transistor 30 turns off to keep the voltage at the gate of pull-down transistor 20 low. Fuse 16 remains intact, charging voltage node 18 and driving the output of inverter 44 low to turn pull-down transistor 42 off. The $S_{outi}$ signal is now latched low to turn off transistor 6 while the $\overline{S_{outi}}$ signal is latched high to turn on transistor 8. The subsequent input of low A address bit will result in the application of a low voltage through transistor 8 to the gate of pull-down transistor 10, keeping the pull-down transistor in an off condition and permitting the redundant word line 2 to be enabled.

Pull-up transistor 46 is used during power-down modes of chip operation to ensure that the voltage at voltage node 18 is grounded. During chip power down the chip voltage supply at the source of pull-up transistor 46 is grounded, causing the gate-drain connection of the pull-up transistor, and hence voltage node 18, to follow suit. Voltage node 18 accordingly cannot maintain any charge which might otherwise be impressed on the node by residual capacitance existing somewhere in the chip circuitry. When power-up of the chip occurs, voltage node 18 will assume a voltage state dependent upon the condition of fuse 16. Where fuse 16 is blown, the low voltage on the gate of pull-up transistor 46 will keep the pull-up transistor in an off condition even as the voltage source rises to its $V_{pp}/V_{cc}$ level. Inverter 44 will in turn output a high value to turn pull-down transistor 42 on, keeping voltage node 18 at ground level to latch the $S_{outi}$ and $\overline{S_{outi}}$ outputs as previously described. Where, however, fuse 16 is intact, power-up conditions in the chip will cause current to flow through fuse 16 and into capacitor 40. Inasmuch as the current capacity of fuse 16 is much greater than that of pull-down transistor 42, the pull-down transistor will be unable to ground or sink the current which the fuse supplies during power-up and capacitor 40 will charge, lifting the voltage of voltage node 18 sufficiently to drive the output of inverter 44 low and shut pull-down transistor 42 off. The $S_{outi}$ and $\overline{S_{outi}}$ signals from the fuse circuit are again latched as previously described, this time reflecting the intact state of fuse 16.

Although only one preferred embodiment of the present invention has been presented, it is understood that various modifications to the structure and function of the redundancy circuit disclosed above can be made by those skilled in the art without departing from the scope and spirit of the present invention. It is therefore the intention of the inventors to be limited only by the scope of the appended claims.

We claim:

1. A circuit for use with a semiconductor memory divided into primary and redundant arrays, which circuit is capable of being programmed to enable a redundant word line in the redundant array whenever a predetermined address bit having a value associated with a faulty word line in the primary array is input to the semiconductor memory, the value of the address bit assuming one of two complementary states depending upon the address location of the faulty word line in the primary array, said circuit comprising:

enabling means connected to the redundant word line for receiving a first enabling signal having first and second complementary values which correspond to the first and second complementary states of the predetermined address bit associated with the faulty word line and for receiving a second enabling signal having first and second complementary values inverted relative to said complementary values of said first enabling signal, said enabling means operating to enable the redundant word line when said first value of said first enabling signal is received by said enabling means, said enabling means also operating to enable the redundant word line when said second value of said second enabling signal is received by said enabling means;

output means connected to receive an output signal and a complementary output signal for supplying said enabling means with said first enabling signal in response to said output and complementary output signals having a first pair of complementary output values and for supplying said enabling means with said second enabling signal in response to said output and complementary output signals having a second pair of complementary output values inverted relative to said first pair of complementary output values; and programmable means for supplying said output means with said output and complementary output signals, said programmable means including a single fuse element which assumes one of two fuse states depending upon the state of the predetermined address bit associated with the faulty word line, said first fuse state of said single fuse element causing said programmable means to generate said first pair of complementary output values for said output and complementary output signals, said second fuse state of said single fuse element causing said programmable means to generate said second pair of complementary output values for said output and complementary output signals.

2. A circuit as set forth in claim 1, wherein said single fuse element comprises a polysilicon fuse.

3. A circuit as set forth in claim 1, wherein said programmable means includes a programming means responsive to the state of the predetermined address bit associated with the faulty word line for programming said single fuse element such that said single fuse element assumes said first fuse state when the predetermined address bit assumes a selected one of its two complementary states, said single fuse element assuming said second fuse state when the predetermined address bit assumes the other of its two complementary states.

4. A circuit as set forth in claim 3, wherein said programming means includes a source of programming current connected to said single fuse element and a switch means capable of operating in two modes also connected to said single fuse element, said switch means in a selected one of its two modes permitting programming current to flow from said source of programming current to said single fuse element as a function of the state of the predetermined address bit associated with the faulty word line.

5. A circuit as set forth in claim 4, wherein said switch means is connected to receive an indication of the state of the predetermined address bit associated with the faulty word line.

6. A circuit as set forth in claim 4, wherein said programming means includes a programming latch means for latching said switch means into one of its two modes when said single fuse element is to be programmed.

7. A circuit as set forth in claim 1, wherein said programmable means further includes an output latch means for latching the values of said output signal and said complementary output signal when said single fuse element has been programmed.

8. A circuit as set forth in claim 1, further including meams for disabling the redundant word line to prevent simultaneous accessing of the redundant word line and the primary word line located at the memory address characterized by all low-logic level address bits.

9. A circuit as set forth in claim 1, wherein the semiconductor memory generates an address bit signal and a complementary address bit signal having a value inverted relative to the value of the address bit signal in response to input of the predetermined address bit to the semiconductor memory, said output means further including a connection mean for receiving the address bit signal and the complementary address bit signal such that the address bit signal serves as said first enabling signal and the complementary address bit signal serves as said second enabling signal.

* * * * *